(12) United States Patent
Makino et al.

(10) Patent No.: US 7,116,168 B2
(45) Date of Patent: Oct. 3, 2006

(54) POWER MULTIPLIER SYSTEM AND METHOD

(75) Inventors: Jun Makino, Singapore (SG); Boon Ghee Ting, Singapore (SG)

(73) Assignee: Creative Technology Ltd, Singapore (SG)

( * ) Notice: Subject to any disclaimer, the term of this patent is extended or adjusted under 35 U.S.C. 154(b) by 113 days.

(21) Appl. No.: 11/001,723

(22) Filed: Dec. 1, 2004

(65) Prior Publication Data

US 2006/0114057 A1    Jun. 1, 2006

(51) Int. Cl.
*H03F 3/217* (2006.01)
(52) U.S. Cl. ...................... 330/251; 330/146
(58) Field of Classification Search .............. 330/10, 330/251, 207 A, 146, 51
See application file for complete search history.

(56) References Cited

U.S. PATENT DOCUMENTS

| | | | |
|---|---|---|---|
| 5,410,592 A | 4/1995 | Wagner et al. | |
| 5,442,317 A | 8/1995 | Stengel | |
| 5,506,493 A | 4/1996 | Stengel | |
| 5,617,058 A * | 4/1997 | Adrian et al. | 330/10 |
| 5,963,086 A | 10/1999 | Hall | |
| 6,385,470 B1 | 5/2002 | Bendixen | |
| 6,646,507 B1 | 11/2003 | Prokin | |
| 6,765,436 B1 * | 7/2004 | Melanson et al. | 330/10 |
| 6,943,620 B1 * | 9/2005 | Andersen et al. | 330/10 |
| 2004/0223624 A1 | 11/2004 | Inagaki | |

FOREIGN PATENT DOCUMENTS

EP   0998048   5/2000

* cited by examiner

*Primary Examiner*—Henry Choe

(57) ABSTRACT

A power multiplier system for an amplifier comprises a power multiplier control stage, an amplifier stage and a first switching stage connectable to the power multiplier control stage. The amplifier stage is connectable to the power multiplier control stage. The power multiplier system has a first output terminal and a second output terminal, the amplifier stage is connectable to the second output terminal for driving a load connectable between the first and second output terminals. The first switching stage is connectable to the first output terminal to apply a switchable DC voltage level to the first output terminal.

There is also disclosed a method of amplifying the power output of an amplifier system.

27 Claims, 9 Drawing Sheets

POWER MULTIPLIER SYSTEM AND METHOD

FIELD OF THE INVENTION

The present invention relates to a power multiplier system and method, and in particular such a system for use in Class D digital amplifiers.

BACKGROUND OF THE INVENTION

Currently, the typical maximum output power that can be derived from a conventional Class D digital amplifier is about 100 Watts to 200 Watts into a 4 Ohms load. There is a limitation on this maximum output power due to the semiconductors used in the amplifiers. It is desirable to keep the size of the integrated circuits used to make the amplifiers small to facilitate compact product design, but at the same time, there is also demand for higher output power, which is especially desirable for Class D digital amplifiers due to their high efficiency.

SUMMARY OF THE INVENTION

In general, the invention provides a power multiplier system and method in which the power of the system is increased by restricting the range of the signal applied to a pulse width modulator stage, applying the output of a first switching stage to an output terminal of the system and applying a switched potential to a further output of the system to create a substantially undistorted output signal.

According to a first aspect of the invention there is provided a power multiplier system for an amplifier comprising:
  a power multiplier control stage;
  an amplifier stage; and
  a first switching stage connectable to said power multiplier control stage; said amplifier stage being connectable to said power multiplier control stage; wherein said power multiplier system has a first output terminal and a second output terminal, said amplifier stage being connectable to said second output terminal for driving a load connectable between said first and second output terminals; and
  wherein said first switching stage is connectable to said first output terminal to apply a switchable DC voltage level to said first output terminal.

According to a second aspect of the invention there is provided a method of amplifying power output from a digital amplifier system having a first output terminal and a second output terminal, the method comprising the steps of:
  applying an input signal to a power multiplier control stage;
  producing one or more signals in said power multiplier control stage;
  controlling an amplifier stage using one or more of said one or more signals;
  driving said second output terminal via said amplifier stage;
  controlling a first switching stage using one or more signals from said power multiplier control stage; and
  selecting in said first switching stage one or more switchable DC voltage levels from a plurality of voltage levels; and
  applying said one or more selected voltage levels to said first output terminal for producing a substantially undistorted waveform across a load connectable between said first and second output terminals.

BRIEF DESCRIPTION OF THE DRAWINGS

Preferred features of the invention will now be described, for the sake of illustration only, with reference to the following Figures in which.

DETAILED DESCRIPTION OF PREFERRED EMBODIMENTS

Figure 1:
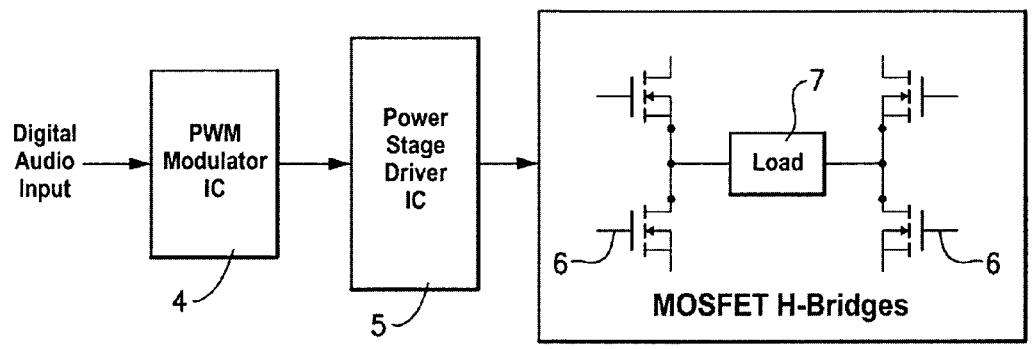
FIG. 1 is a schematic block diagram of a conventional Class D digital amplifier configuration.

FIG. 1 shows a block diagram of a conventional Class D digital amplifier system driving a speaker load, in a single channel within a BTL configuration.

The system comprises a pulse width modulator integrated circuit 4, a power stage driver integrated circuit 5, and a MOSFET H-bridge stage 6 driving a load 7. The digital audio input signal is fed to the pulse width modulator circuit 4 and the pulse width modulated signal output from the pulse width modulator circuit 4 is applied to the power stage driver 5. The output of the power stage driver 5 drives the MOSFET H-bridge stage 6 which in turn drives the load 7.

The peak amplitude of the digital input signal in the system of FIG. 1 to produce the maximum undistorted output to the load 7 ($V_{cc}$ volts peak-to-peak) may be denoted as A. In this configuration, the main limitation on the output power is due to the power handling capability of the power stage driver IC 5.

Figure 2:
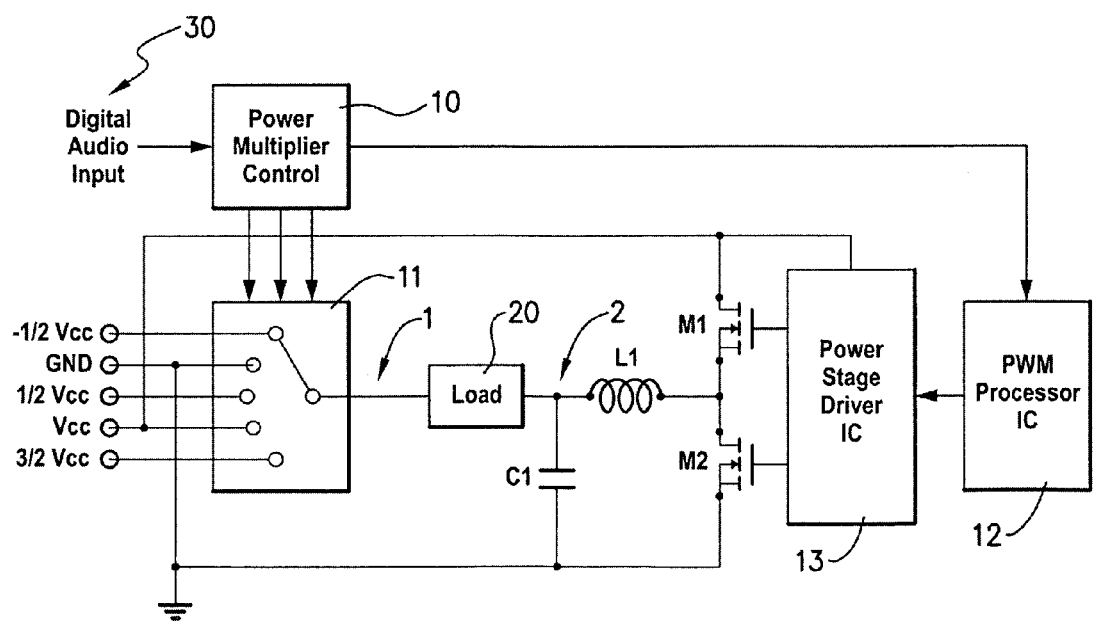
FIG. 2 is a schematic circuit diagram of an amplifier according to a preferred embodiment of the invention.

FIG. 2 illustrates a system according to a first preferred embodiment of the invention and comprises a power multiplier control stage 10, a switching stage 11, a pulse width modulator stage 12, a power driver stage 13, two power MOSFETs M1, M2, an inductor L1, a capacitor C1, and a load 20. The pulse width modulator stage 12, the power driver stage 13, and the two power MOSFETs M1 and M2 form an amplifier stage.

In the system of FIG. 2, the digital audio input signal 30 is applied to the power multiplier control stage 10 which multiplies the signal amplitude by, for example, 3 and checks the level of the signal. If the signal is below A, which is the peak amplitude of the digital input signal in a conventional Class D amplifier which will produce the maximum peak-to-peak undistorted output for a supply voltage $V_{cc}$, the switching stage 11 which is preferably a multiway switch will select the voltage $\frac{1}{2} V_{cc}$.

If the level of the signal exceeds A, the multiway switch 11 will switch to ground (GND) and a level A will be subtracted from the result of the input signal multiplied by 3. If the level exceeds 2 A, the switch 11 will select the voltage $-\frac{1}{2} V_{cc}$ and a level 2A will be subtracted from the result of the signal multiplied by 3. In both cases, this result will be sent to the pulse width modulator stage 12 which is preferably a PWM processor IC. Thus the amplitude of the input to the PWM processor IC 12 is always kept below A so that no overflow will occur and the signal remains within the linear working range of the system.

The multiplied signal is applied to the pulse width modulator 12 to produce a train of width-modulated pulses which are then applied to the power driver stage 13.

Similarly, for the negative peak of the input signal 30, if the level of the signal exceeds −A or −2 A, the Multiway Switch 11 will switch to $V_{cc}$ or $\frac{3}{2} V_{cc}$ respectively. Also, −A or −2 A will be subtracted from the result of the signal multiplied by 3 and this result will be sent to the PWM processor IC 12.

The power driver stage 13 drives the two MOSFETs M1 and M2 which are coupled in series across a power supply $V_{cc}$. The junction of the two MOSFETs M1 and M2 is connected to a first end of the inductor L1. The output of L1 is coupled to one side of the capacitor C1 at a node 2 and also to one terminal of the load 20. The other side of the capacitor C1 is connected to ground. The digital outputs from the power multiplier control 10 are applied to the switching stage 11 which is also coupled to a range of voltage sources $V_{cc}$, $\frac{3}{2}V_{cc}$, $\frac{1}{2}V_{cc}$, ground and $-\frac{1}{2}V_{cc}$.

The switching stage 11 selects one of the voltage sources as determined by the power multiplier control unit 10 and the selected voltage level is applied to the second side of the load 20 at a node 1. The inductor L1 and the capacitor C1 form a low pass filter.

Figure 3:
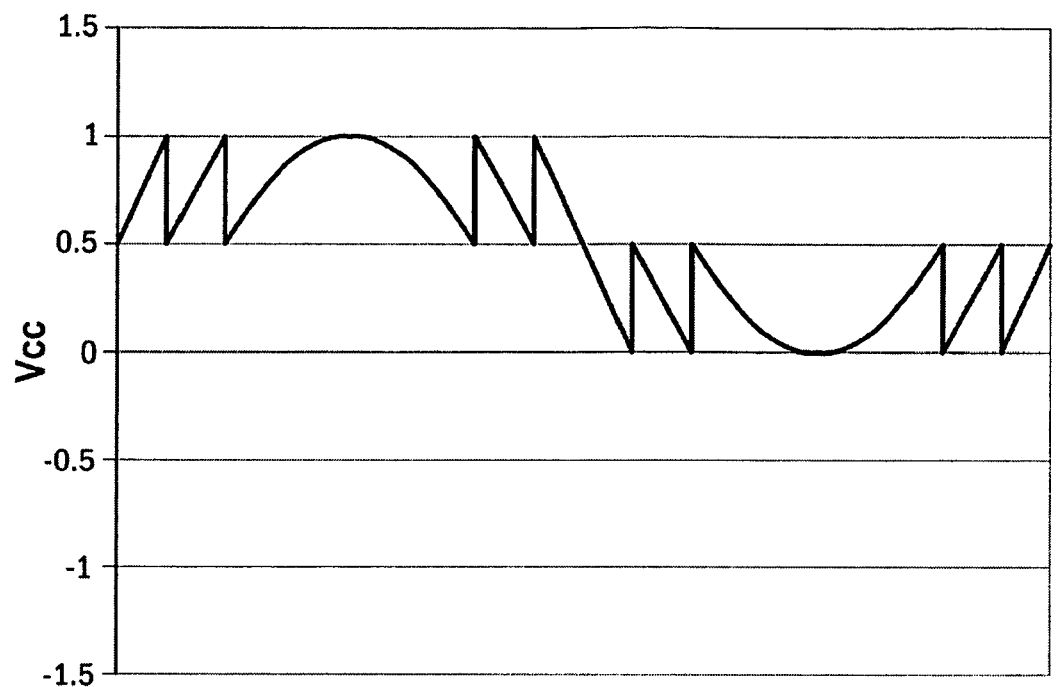
FIG. 3 is a waveform of an output signal at node 2 in the circuit of FIG. 2.

FIG. 3 shows a plot of the signal at node 2 of the circuit of FIG. 2 if a sinusoidal input signal of amplitude A is applied as the audio input signal 30.

Figure 4:
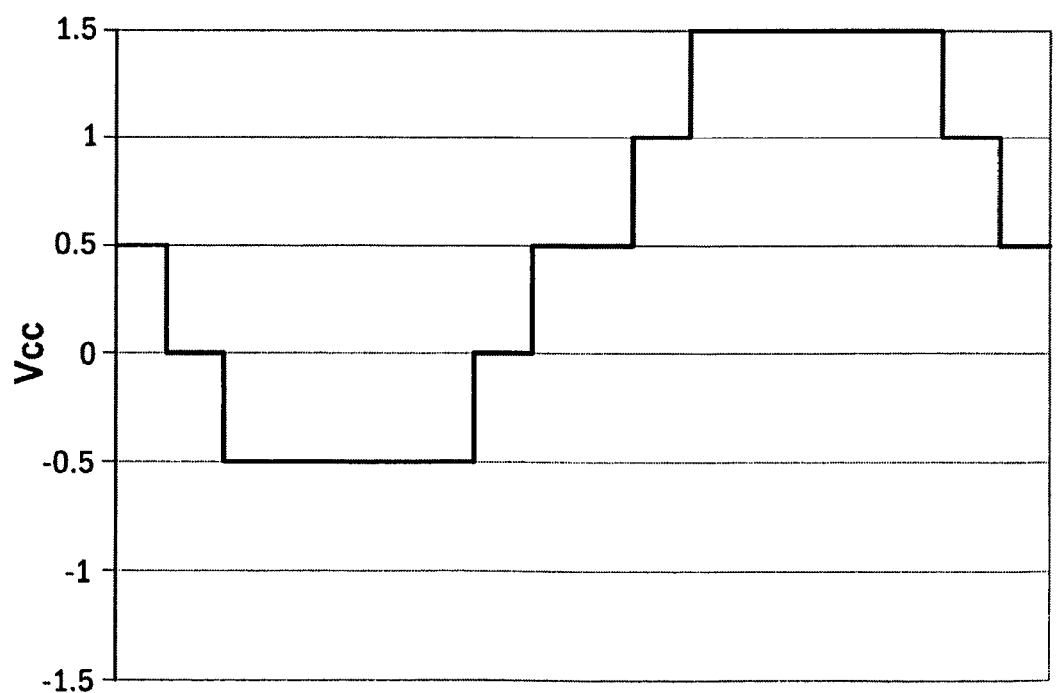
FIG. 4 is a waveform of a signal at node 1 in the circuit of FIG. 2.
Figure 5:
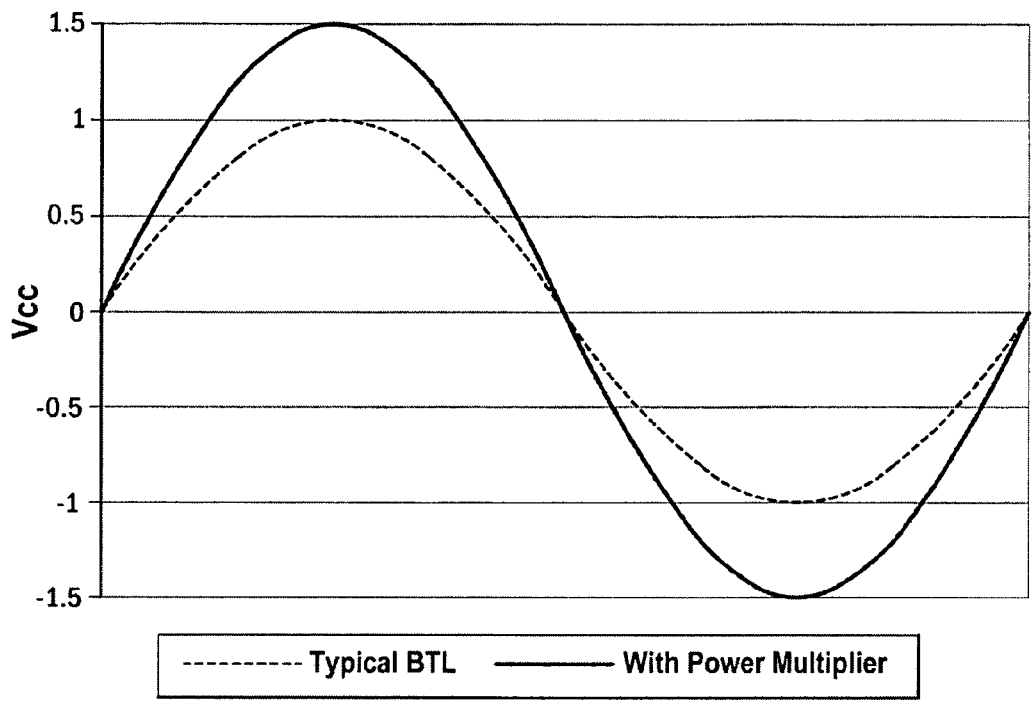
FIG. 5 is a waveform of a signal present across the load in the circuit of FIG. 2 and a waveform of a signal from a conventional bridge-tied load (BTL) amplifier.
Figure 6:
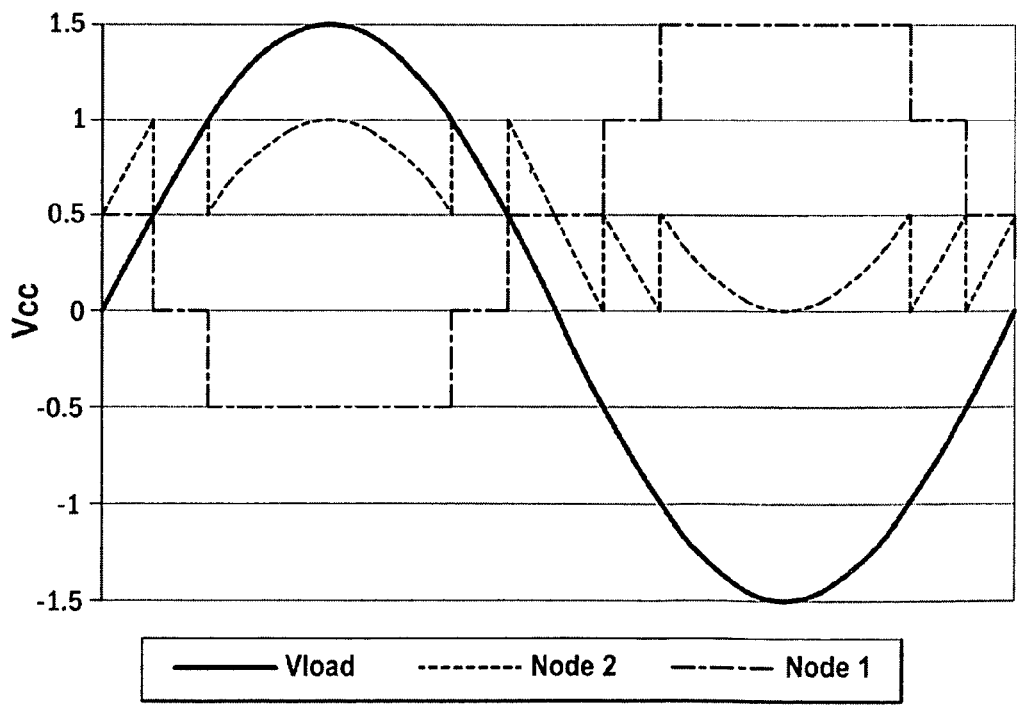
FIG. 6 is a representation of the waveforms across the load, at node 2 and at node 1 in the circuit of FIG. 2.

FIG. 4 shows a plot of the corresponding signal at Node 1. FIG. 5 shows a plot of the corresponding overall signal across the load 20 in the system of FIG. 2 and a waveform of a signal from a conventional bridge-tied load (BTL) amplifier. FIG. 6 shows the signal at node 1, node 2 and across the load 20 in one plot using the system of FIG. 2.

As shown in FIG. 5, using the system of FIG. 2, a peak amplitude of $1.5V_{cc}$ is achieved as compared to a conventional system of the type shown in FIG. 1 in which a peak amplitude of $V_{cc}$ is achieved, using the same integrated circuits in both cases. In terms of power, by using the system of FIG. 2, the output power may be increased by, for example, 2.25 times the power from a conventional system of the type shown in FIG. 1, and this is shown in the calculations below.

$$\text{Original Output Power,} \quad Po = \frac{V_0^2}{R}$$

$$\begin{aligned}
\text{Power Multiplier Output Power,} \quad Px &= \frac{V_X^2}{R} \\
&= \frac{\left(\frac{3}{2}V_0\right)^2}{R} \\
&= \frac{9}{4}\frac{V_0^2}{R} \\
&= 2.25 P_0
\end{aligned}$$

As the power multiplier control stage 10 may be implemented using a digital signal processor, the system of FIG. 2 may be implemented readily by use of an appropriate algorithm. It may also be possible and desirable to include the power multiplier control stage 10 within the PWM processor 12 as this will reduce the number of integrated circuits required.

Although the input signal 30 has been described and illustrated as being a pure sine wave, any form of input signal may be used.

Figure 7:
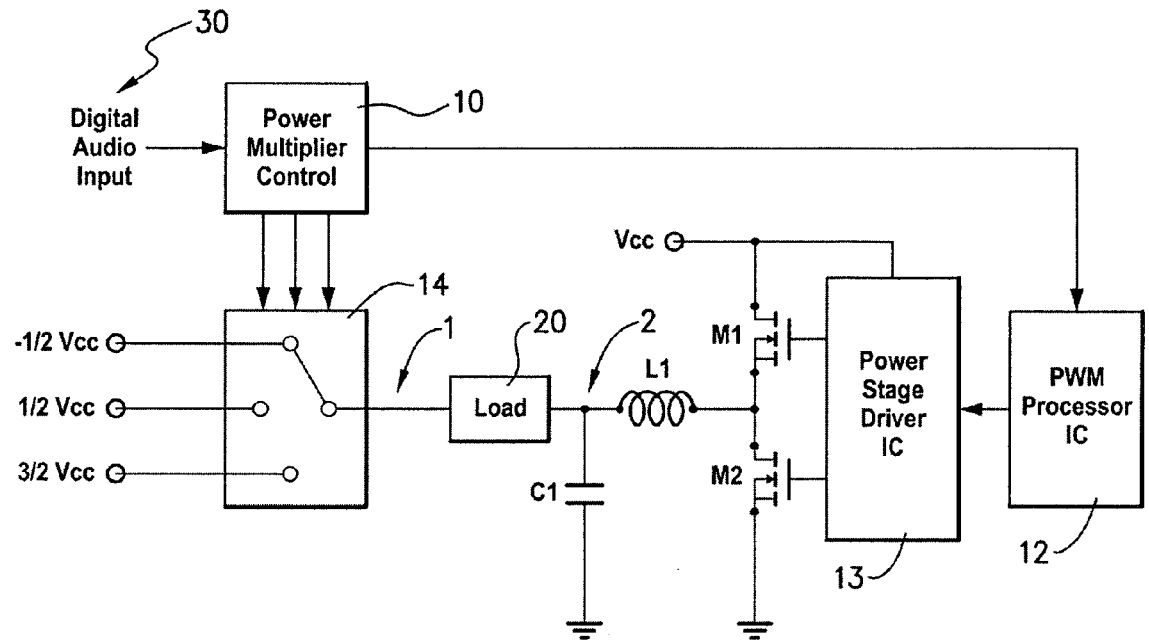
FIG. 7 is a schematic circuit diagram of an amplifier according to a further preferred embodiment of the invention.

An alternative embodiment of a system according to a further preferred embodiment of the invention is shown in FIG. 7. The circuit of FIG. 7 is identical to that shown in FIG. 2 with the exception that the number of switched voltages has been reduced to 3, that is, to $-\frac{1}{2}V_{cc}$, $\frac{1}{2}V_{cc}$ and $\frac{3}{2}V_{cc}$.

In the embodiment of FIG. 7, the power multiplier control stage 10 multiplies the input signal by 5 and checks the level of the signal. If the signal is below A, the multiway switch 11 will select the voltage $\frac{1}{2}V_{cc}$ to be applied to a first side of the load 20. If the level of the signal exceeds A, the multiway switch 11 will switch to $-\frac{1}{2}V_{cc}$. At the same time, 2 A is subtracted from the result of the signal multiplied by 5 and this result will be sent to the PWM processor IC 12.

Similarly, for the negative side, if the level exceeds −A, the multiway switch 11 will select the voltage $\frac{3}{2}V_{cc}$ and −2 A will be subtracted from the result of the signal multiplied by 5 and this result will be sent to the PWM processor IC 12.

Figure 8:
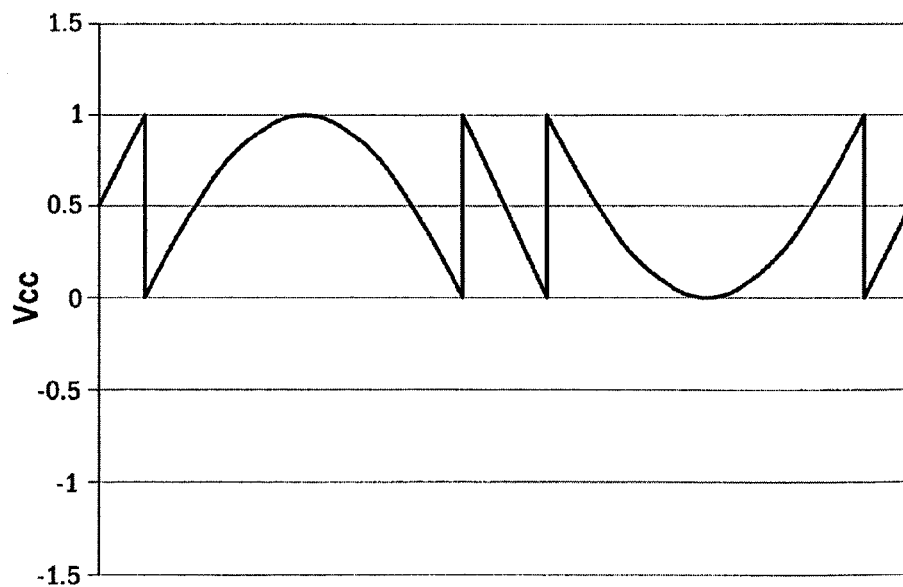
FIG. 8 is a waveform of an output signal at node 2 in the circuit of FIG. 7.

FIG. 8 shows a plot of the signal at node 2 of the system of FIG. 7 if a sinusoidal input signal of amplitude A is applied as the digital audio input signal 30.

Figure 9:
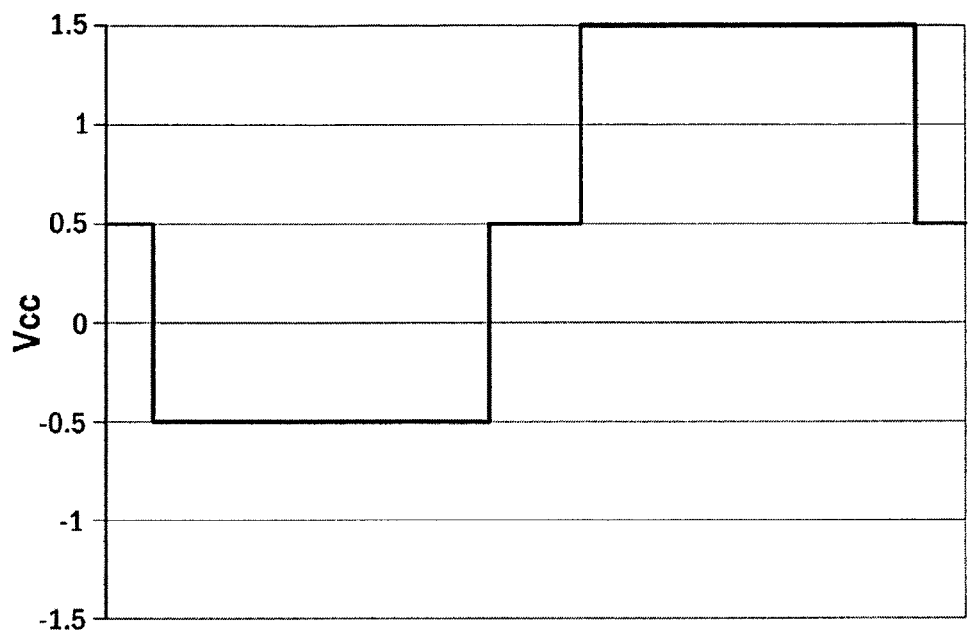
FIG. 9 is a waveform of a signal at node 1 in the circuit of FIG. 7.
Figure 10:
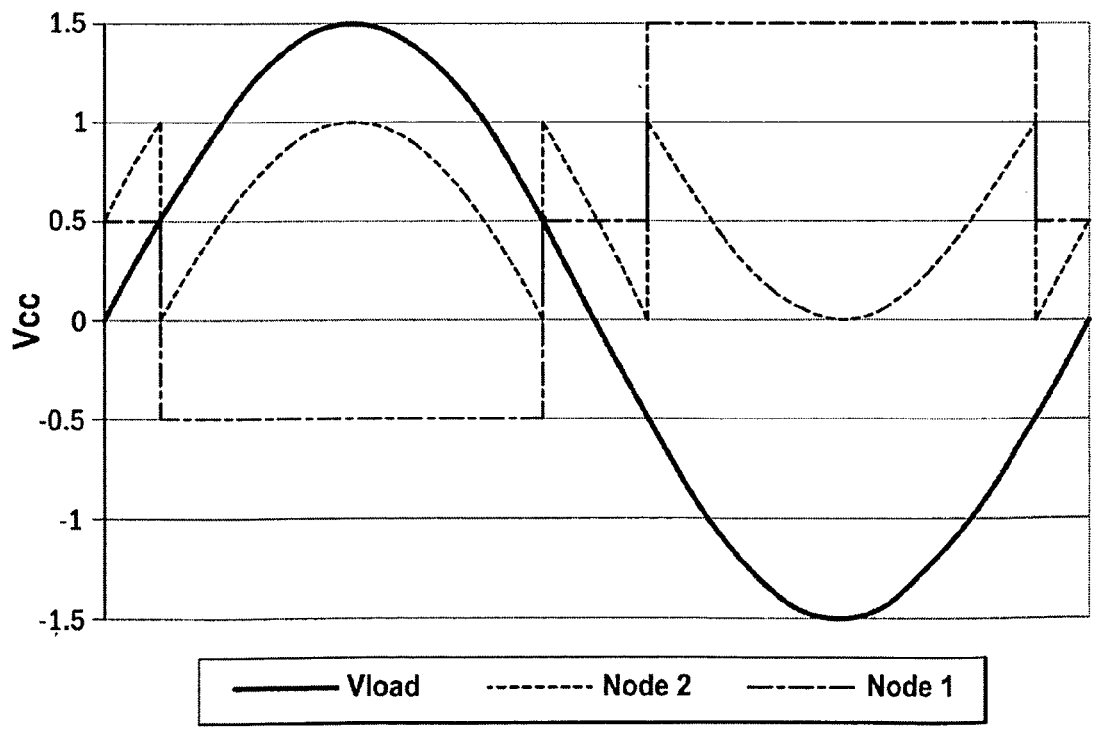
FIG. 10 is a representation of the waveforms across the load, at node 2 and at node 1 in the circuit of FIG. 7.

FIG. 9 shows a plot of the corresponding signal at Node 1 in the system of FIG. 7 and FIG. 10 shows the signal at node 1, node 2 and across the load 20 of the system of FIG. 7 in one plot.

Figure 11:
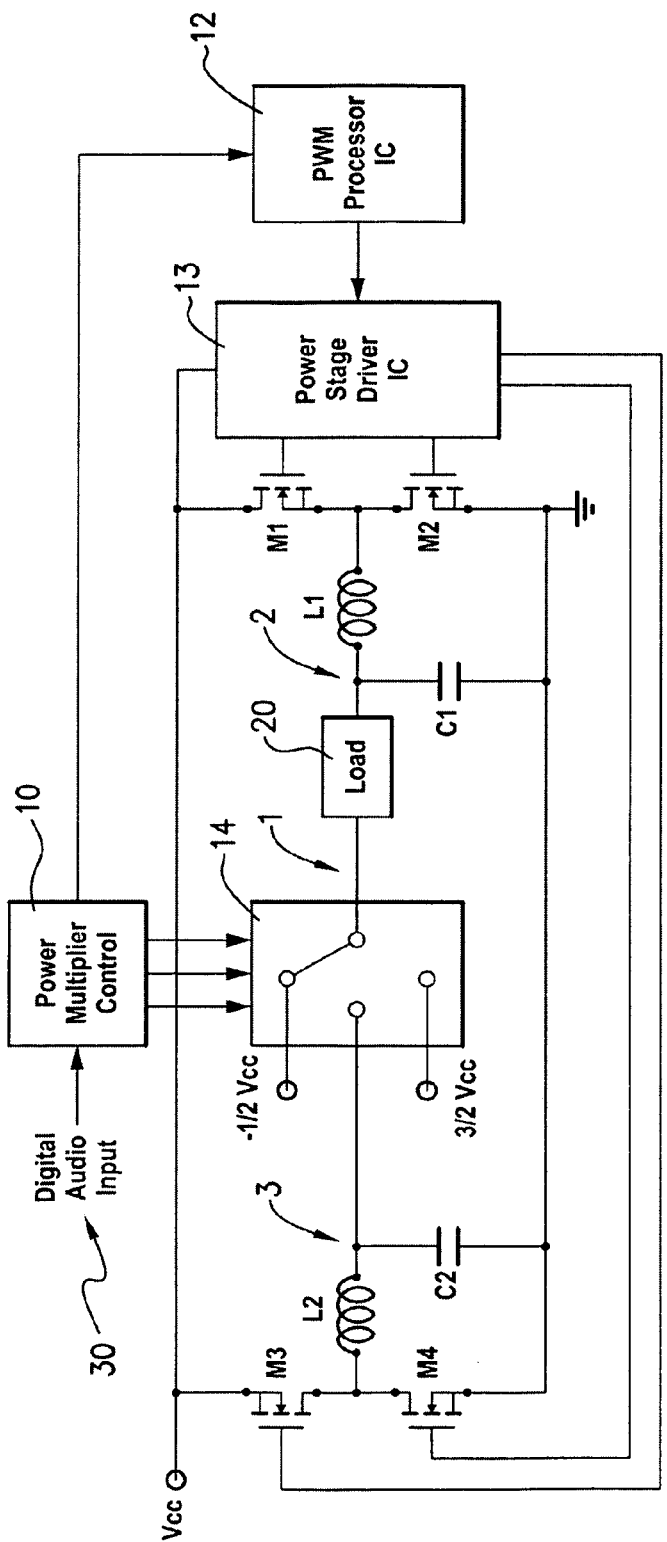
FIG. 11 is a schematic circuit diagram of an amplifier according to another preferred embodiment of the invention.

FIG. 11 shows a further preferred embodiment of the present invention which differs from the embodiments of FIGS. 2 and 7 in that the MOSFET drive involves a full bridge, whereas for the first described embodiment shown in FIG. 2, it can be seen that only half an H-Bridge is used. The embodiment of FIG. 11 also has fewer steps of switching voltages, than the embodiment of FIG. 2.

In the system of FIG. 11, the digital input signal 30 is applied to the power multiplier control stage 10 where it is multiplied and sampled. As in the system of FIG. 2, the amplitude of the signal level is checked and adjusted as required to keep the level within the working range of the PWM processor 12. The multiplied output signal is applied to the PWM processor 12, the width modulated pulses from which are then applied to the input of the power driver stage 13. The outputs from this stage 13, as well as being applied to the MOSFETS M1 and M2, are also applied to two further MOSFETs M3 and M4. M1 and M2 are connected in series across the power supply $V_{cc}$ to ground, the junction being taken to inductor L1, the second terminal of which is connected to a first terminal of capacitor C1 and a first terminal of the load 20 at node 2. The MOSFETs M3 and M4 are connected in series across the supply $V_{cc}$ to ground. The junction between M3 and M4 is connected to a first terminal of an inductor L2, the second terminal of which is connected to capacitor C2. The other terminals of the capacitors C1 and C2 are connected to ground. The second terminal of L2 is further connected to an input of the switching unit 14 at node 3. The other voltage inputs to the switching unit 14 are $-\frac{1}{2} V_{cc}$ and $\frac{3}{2}V_{cc}$. The switching operation is controlled by the power multiplier stage 10.

Figure 12:
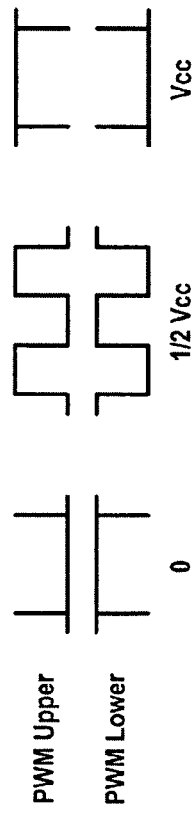
FIG. 12 is a schematic representation of the pulse width modulated signal for DC modulated voltages from the pulse width modulator in the circuit of FIG. 11.

In the system of FIG. 11, the working principles are the same as the embodiment of FIG. 2, but in the configuration of FIG. 11 the DC voltages of GND, $\frac{1}{2} V_{cc}$ and $V_{cc}$ are provided to Node 1 of the load to the side of the H-Bridge connected to the 3-way switch 14. The DC voltages are applied through the 3-way switch 14 by controlling the width of the pulse width-modulated (PWM) signal applied from the power driver stage 13 to M3 and M4 through the low pass filter formed by L2 and C2. The PWM signals for producing these DC voltages are shown in FIG. 12.

Figure 13:
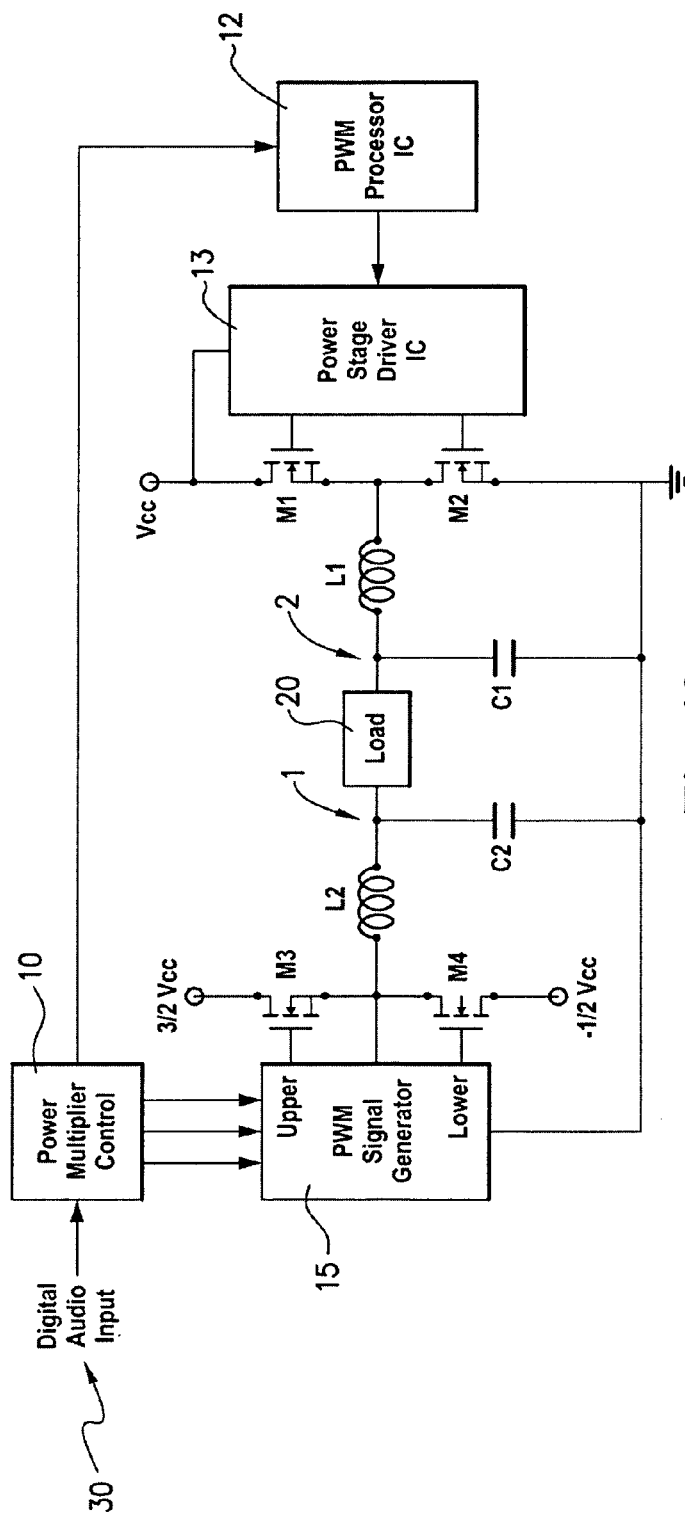
FIG. 13 is a schematic circuit diagram of an amplifier according to another preferred embodiment of the invention.

A further alternative preferred embodiment of the invention is shown in FIG. 13. In this embodiment, the input signal 30 is applied to the power multiplier control 10 the output of which is applied to the pulse width modulator 12. The pulse width modulated pulses therefrom are applied to the power driver stage 13 and the outputs of this stage control MOSFETs M1 and M2 connected in series across the supply. The junction of the MOSFETs M1 and M2 is connected to the first terminal of an inductor L1, the second terminal of which is connected to a first terminal of a load 20 and a first terminal of a capacitor C1 to form node 2. The control outputs from the power multiplier control stage 10 are applied to a pulse width modulated signal generator stage 15 which provides outputs to drive a further pair of MOSFETs M3 and M4 which are connected in series between supplies $\frac{3}{2}V_{cc}$ and $-\frac{1}{2} V_{cc}$. The junction of the MOSFETs M3 and M4 is connected to a first terminal of an inductor L2, the second terminal of which is coupled to a first terminal of a capacitor C2 and a second terminal of a load 20 to form node 1. The second terminals of C1 and C2 are both connected to ground.

In the embodiment of FIG. 13, the switching among the DC voltages $-\frac{1}{2}$ Vcc, GND, $\frac{1}{2}$ Vcc, Vcc and $\frac{3}{2}$ Vcc to Node 1 are provided by a PWM Signal Generator 15 through the low pass filter formed by L2 and C2, by controlling the width of the PWM signal, which is as shown below in FIG. 14.

Figure 14:
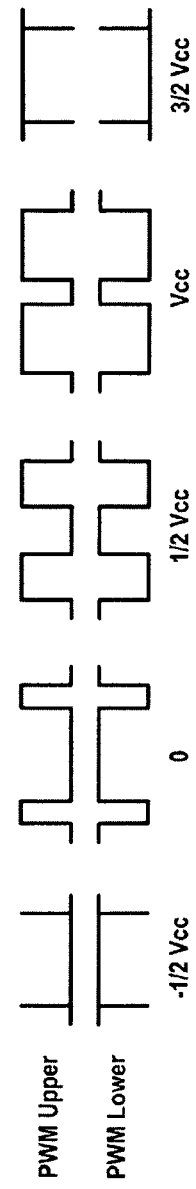
FIG. 14 schematic representation of the pulse width modulated signal for DC modulated voltages from the pulse width modulator in the circuit of FIG. 13.

FIG. 14 shows the pulse width modulated signals applied to M3 and M4 respectively the system of FIG. 13 for the various switching voltages.

To obtain the switching voltage of $-\frac{1}{2}V_{cc}$, the upper transistor M3 is turned off and the lower transistor M4 is turned on.

To obtain the ground condition, the upper transistor M3 is turned on for ⅓ of the cycle whilst the lower transistor M4 is turned off and then M3 is turned off whilst M4 is turned on for the remaining ⅔ of the cycle.

To obtain the switching voltage $\frac{1}{2}V_{cc}$, M3 is switched on for half of the cycle whilst M4 is switched off and then for the remaining half of the cycle M3 is turned off whilst M4 is turned on.

To obtain the switching voltage $V_{cc}$, M3 is turned on for ⅔ of the cycle whilst M4 is turned off and M4 is then turned on for the remaining ⅓ of the cycle whilst M3 is turned off.

To obtain the switching voltage $\frac{3}{2}V_{cc}$, M3 is turned on and M4 is turned off for the duration of the cycle.

Figure 15:
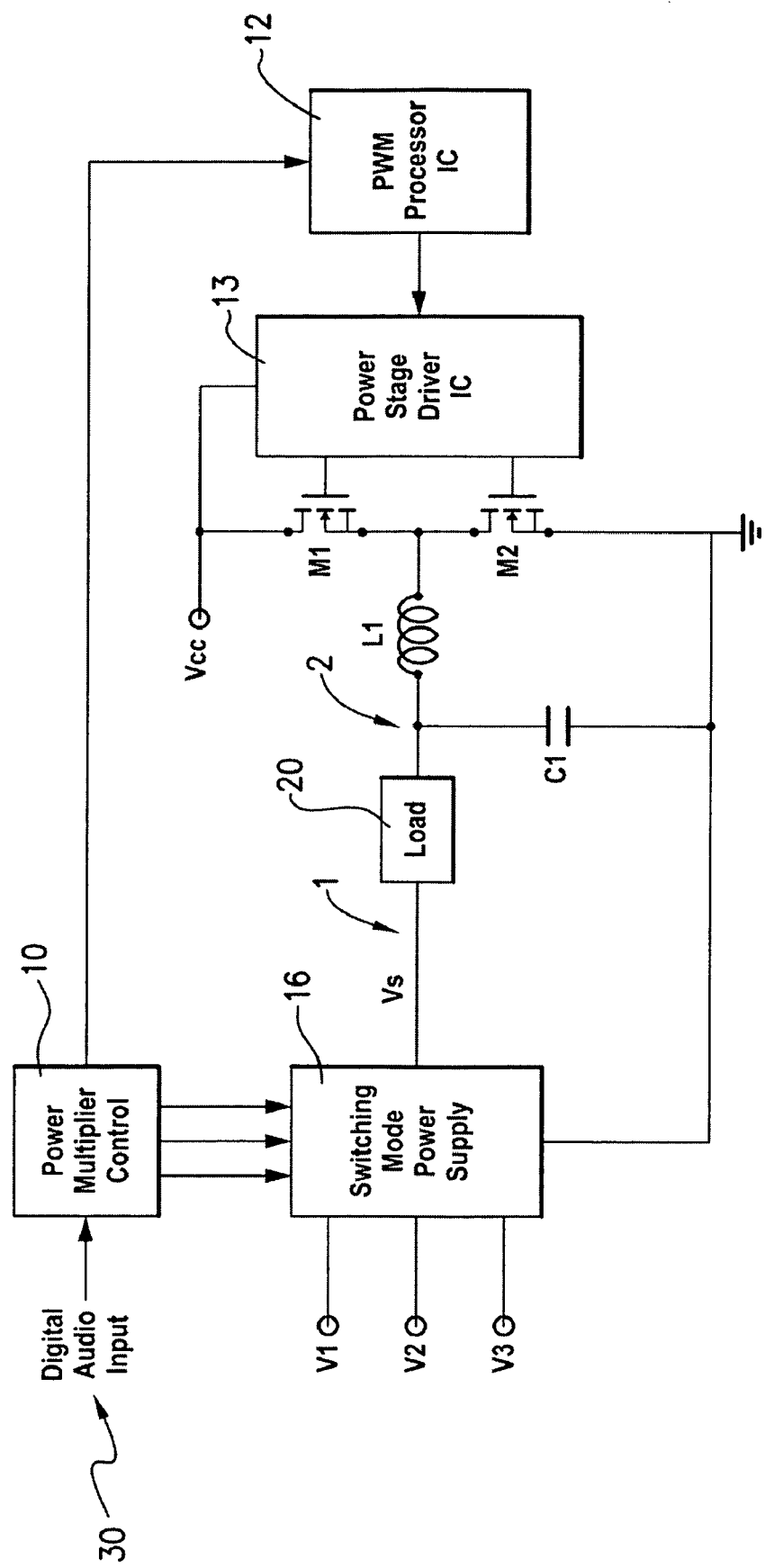
FIG. 15 is a schematic circuit diagram of an amplifier according to yet another preferred embodiment of the invention.

A further preferred embodiment of the invention is shown in FIG. 15. A Switching Mode Power Supply is used for switching among the DC voltages. As in the system of FIG. 2, the amplitude of the signal level is checked and adjusted as required to keep the level within the working range of the PWM processor 12. The digital audio input signal 30 is applied to a power multiplier control stage 10 where it is multiplied and the multiplied output is then applied to the pulse width modulator stage 12. The pulse width modulated pulses from the pulse width modulator stage 12 are applied to a power driver stage 13 which drives a pair of MOSFET transistors M1 and M2 connected in series across the supply. The junction of the MOSFET transistors M1 and M2 is connected to a first terminal of an inductor L1 and the second terminal of the inductor L1 is connected to a first terminal of a capacitor C1 and a first terminal of a load 20 to form node 2.

The switching outputs of the power multiplier control stage 10 are applied to a switching mode power supply 16 to switch the output voltages thereof between $-\frac{1}{2}V_{cc}$, ground, $\frac{1}{2}V_{cc}$ and $\frac{3}{2}V_{cc}$.

The output voltages of the switching mode power supply 16 are applied to the second terminal of the load 20 to form node 1 and the second terminal of the capacitor C1 is connected to ground. Further outputs voltages V1, V2 and V3 from the switching mode power supply 16 shown in FIG. 15 are other voltages supplied to other devices within the equipment, for example, a microcontroller.

As the power multiplier control stage 10 may be implemented using a digital signal processor, the systems of FIGS. 2, 7, 11, 13, and 15 may be implemented readily by use of an appropriate conventional control algorithm.

Figure 16:
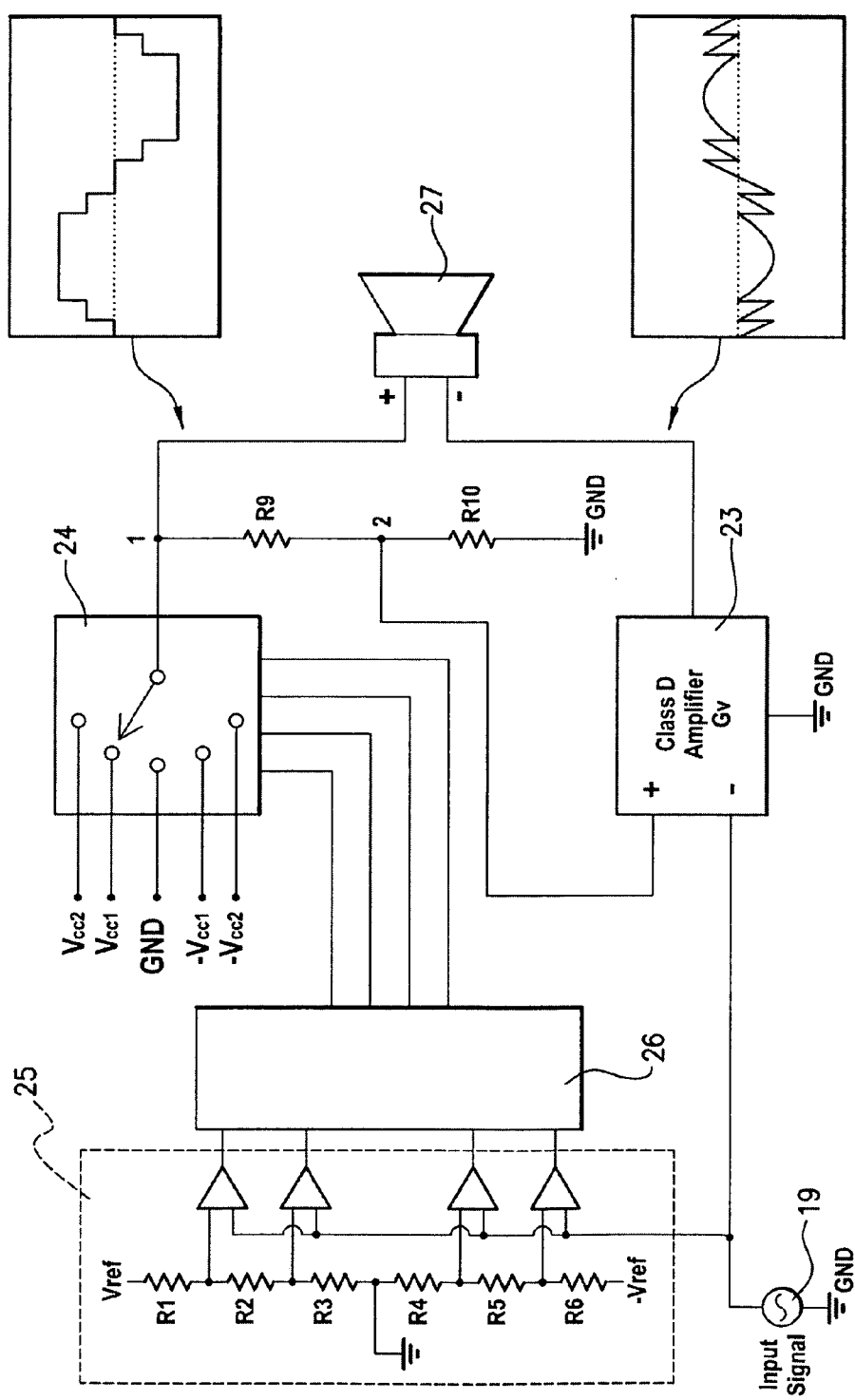
FIG. 16 is a schematic circuit diagram of a further preferred embodiment of the invention operating in analogue mode.

FIG. 16 illustrates a further preferred embodiment of the present invention working in the analogue mode which is in contrast to the embodiments of FIGS. 2, 7, 11, 13 and 15 which work in the digital mode. The system of FIG. 16 includes a Class D analogue amplifier 23 having a first (positive) input and a second (negative) input, a switching stage 24, a comparator stage 25, a further interface stage 26, a load 27 and a resistive potential divider network formed of resistors R9 and R10 having a division ratio equivalent to the inverse of the gain of the amplifier 23. The comparator stage 25 and the further interface stage 26 form a power multiplier control stage.

In the system of FIG. 16, the analogue input signal 19 is applied to the negative input of the Class D analogue amplifier 23 which has a gain of Gv. The analogue input signal 19 is also applied to the comparator stage 25 wherein it is compared with a plurality of DC voltages obtained from a positive voltage supply Vref and a negative voltage supply −Vref. Within the comparator stage 25 a serially connected chain of six resistors R1 to R6 is connected between Vref and −Vref to provide the plurality of DC voltages. The junction of resistors R3 and R4 is connected to ground. Also within the comparator stage 25 are four comparators. The analogue input signal 19 is applied to one input of each comparator and the other input of each comparator is connected to a junction in the chain of resistors R1 to R6, the junctions being between R1 and R2, R2 and R3, R4 and R5 and R5 and R6. Preferably, resistors R1 to R6 are equal in resistive value. Thus the signal is compared with voltages ±⅓Vref and ±⅔Vref.

The outputs of the comparators are coupled to the further stage 26 which may comprise a control circuit to control The switching stage 24. The outputs of the stage 26 are coupled to the switching stage 24.

The output of the switching stage 24 is coupled to a first (positive) terminal of the load 27 and also to resistor R9 of the potential divider formed by resistors R9 and R10. The junction between R9 and R10 is coupled to a first (positive) terminal of the Class D analogue amplifier 23. The other terminal of R10 is connected to ground. The output of the second (negative) terminal of the load 27 is connected to the output of the Class D analogue amplifier 23.

In the system of FIG. 16, the supply voltage to the Class D amplifier 23 need only be one third of the total output voltage swing. If, therefore, the total undistorted output voltage is ±Vcc, then Vref is chosen such that an input swing of ±Vref will give an undistorted output of ±Vcc.

If the positive excursion of the incoming signal 19 exceeds the level ⅓ Vref, then the comparator connected at the junction of R2 and R3 will give an output which, via the stage 26, sets the switching stage 24 to give an output Vcc1 which corresponds to ⅓Vcc.

If the positive excursion exceeds ⅔ Vref, then the comparator connected to the junction of R1 and R2 produces an output which sets the switching stage 24 to give an output of Vcc2 which is equal to ⅔ Vcc.

If the negative excursion of the incoming signal 19 exceeds the level −⅓ Vref, then the comparator connected at the junction of R4 and R5 will give an output which the stage 26 will use to set the switching stage 24 to give an output of −Vcc1 which corresponds to −⅓Vcc.

If the negative excursion exceeds −⅔ Vref, then the comparator connected to the junction of R5 and R6 produces an output which sets the switching stage 24 to give an output of −Vcc2 which is equal to −2Vcc1.

The waveforms at the first (positive) and second (negative) terminals of the load 27 are also shown in FIG. 16. In the embodiment of FIG. 16, the Class D amplifier 23 can achieve a higher output power than the amplifier alone was designed to produce. As in the embodiments of FIGS. 2 to 15, it is possible to produce higher output power than conventional amplifier designs without increasing the voltage applied to the amplifier or to produce the same output power at a lower supply voltage.

As the junction between resistors R9 and R10 is connected to the positive terminal of the Class D analogue amplifier 23, the signal level at this junction is subtracted from the input signal level so that the resulting level of the signal output from the amplifier 23 is within the linear working range of the amplifier 23.

Various modifications to the embodiments of the present invention described above may be made. For example, other components and method steps can be added or substituted for those above. Thus, although the invention has been described above using particular embodiments, many variations are possible within the scope of the claims, as will be clear to the skilled reader, without departing from the spirit and scope of the invention.

The invention claimed is:

1. A power multiplier system for an amplifier comprising:
   a power multiplier control stage;
   an amplifier stage; and
   a first switching stage connectable to said power multiplier control stage; said amplifier stage being connectable to said power multiplier control stage; wherein said power multiplier system has a first output terminal and a second output terminal, said amplifier stage being connectable to said second output terminal for driving a load connectable between said first and second output terminals; and
   wherein said first switching stage is connectable to said first output terminal to apply a switchable DC voltage level to said first output terminal.

2. A power multiplier system according to claim 1, wherein said amplifier comprises:
   a pulse width modulator stage connectable to said power multiplier control stage,
   a power driver stage connectable to said pulse width modulator stage; and
   a second switching stage connectable to said power driver stage; wherein said second switching stage is connectable to said second output terminal for driving a load connectable between said first and second output terminals.

3. A power multiplier system according to claim 2, further comprising a low pass filter connectable between said second switching stage and ground.

4. A power multiplier system according to claim 2, wherein said second switching stage comprises at least two MOSFETs connectable in series.

5. A power multiplier system according to claim 2, wherein said first switching stage comprises a selector for selecting one or more of a number of predetermined DC voltage levels to be applied to said first output terminal.

6. A power multiplier system according to claim 2, wherein said power multiplier control stage comprises a multiplier, a subtractor and a comparator.

7. A power multiplier system according to claim 2, further comprising a third switching stage connectable to said power driver stage and said first switching stage to provide a number of switchable DC voltage levels to said first output terminal through the first switching stage.

8. A power multiplier system according to claim 7, wherein said third switching stage comprises at least two MOSFETs connectable in series.

9. A power multiplier system according to claim 2, wherein said first switching stage comprises a pulse width modulated signal generator.

10. A power multiplier system according to claim 2, wherein said first switching stage comprises a switching mode power supply.

11. A power multiplier system according to claim 1, wherein said amplifier stage comprises a Class D analogue amplifier having a first input and a second input and a gain.

12. A power multiplier system according to claim 11, further comprising a potential divider connectable to said first input of said amplifier, and having a division ratio corresponding to the inverse of said gain of said amplifier.

13. A method of amplifying power output from a digital amplifier system having a first output terminal and a second output terminal, the method comprising the steps of:
   applying an input signal to a power multiplier control stage;
   producing one or more signals in said power multiplier control stage;
   controlling an amplifier stage using one or more of said one or more signals;
   driving said second output terminal via said amplifier stage;

controlling a first switching stage using one or more signals from said power multiplier control stage; and selecting in said first switching stage one or more switchable DC voltage levels from a plurality of voltage levels; and applying said one or more selected voltage levels to said first output terminal for producing a substantially undistorted waveform across a load connectable between said first and second output terminals.

14. A method according to claim 13, wherein the step of controlling the amplifier stage comprises controlling a pulse width modulating stage using one or more of said one or more signals to produce a train of width modulated pulses; and wherein the step of driving said second output terminal comprises driving said second output terminal via a second switching stage using said train of width modulated pulses.

15. A method according to claim 14, further comprising filtering in a low pass filter said train of width modulated pulse from said first switching stage prior to applying said train of pulses to said first output terminal.

16. A method according to claim 14, wherein the step of driving said second output terminal in said second switching stage comprises driving at least two MOSFETs connectable in series.

17. A method according to claim 14, wherein the step of selecting in said first switching stage comprises selecting one or more of a number of predetermined DC voltage levels to be applied to said second output terminal.

18. A method according to claim 14, wherein the step of producing one or more signals in said power multiplier control stage comprises:

multiplying said input signal by a predetermined factor;

comparing said input signal with a predetermined reference value and if said input signal exceeds said reference value, reducing said input signal for maintaining the signal applied to said pulse width modulator within a working range of said modulator; and determining one or more control signals to control said first switching stage dependent on the amplitude of said input signal.

19. A method according to claim 14, further comprising providing a number of switchable DC voltage levels to said first output terminal through the first switching stage using a third switching stage connectable to said power driver stage and said first switching stage.

20. A method according to claim 19, wherein said step of providing a number of said levels comprises using at least two MOSFETs connectable in series.

21. A method according to claim 14, wherein said step of selecting in said first switching stage said one or more voltages to be applied to said first output terminal comprises generating a pulse width modulated signal having a plurality of pulses each pulse having a width associated therewith, said width being controlled by said power multiplier control stage.

22. A method according to claim 21, further comprising driving a third switching stage using said plurality of pulses to apply a selected voltage level to said first output terminal via a low pass filter.

23. A method according to claim 14, wherein said step of selecting in said first switching stage said one or more voltages to be applied to said first output terminal comprises switching a switching mode power supply to produce a predetermined voltage to be applied to said first output terminal, said voltage being determined by said one or more signals from said power multiplier control stage.

24. A method according to claim 14, wherein said step of driving said second output terminal comprises applying said input signal to a negative input of said amplifier stage, applying a DC voltage from the output of the switching stage via a potential divider to the positive input of the amplifier stage such that the output of the amplifier stage remains within a linear working range of said amplifier.

25. A method according to claim 13, wherein the step of producing one or more signals in said power multiplier control stage comprises comparing said input signal with a predetermined reference value and, if said input signal exceeds said reference value, determining said one or more control signals to control said first switching stage dependent on the amplitude of the input signal.

26. A method according to claim 25, wherein said amplifier stage has a gain, said method further comprising controlling said amplifier stage using said one or more control signals, said step of controlling comprising attenuating the output from said first switching stage to provide an attenuated signal attenuated by an amount corresponding to the gain of said amplifier stage and subtracting said attenuated signal from said input signal to maintain the signal output from said amplifier stage within its working range.

27. A power multiplier system according to claim 11, wherein said power multiplier control stage comprises a comparator stage and an interface stage.

* * * * *